(12) United States Patent
De Saulles et al.

(10) Patent No.: US 11,226,654 B2
(45) Date of Patent: Jan. 18, 2022

(54) PIVOTING PLATE FLEXIBLE DISPLAY

(71) Applicant: HEWLETT-PACKARD DEVELOPMENT COMPANY, L.P., Houston, TX (US)

(72) Inventors: Stephen De Saulles, London (GB); Stacy L Wolff, Houston, TX (US); Kevin L Massaro, Houston, TX (US); Dimitre Mehandjiysky, Houston, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 746 days.

(21) Appl. No.: 16/074,305

(22) PCT Filed: Aug. 12, 2016

(86) PCT No.: PCT/US2016/046740
§ 371 (c)(1),
(2) Date: Jul. 31, 2018

(87) PCT Pub. No.: WO2018/031030
PCT Pub. Date: Feb. 15, 2018

(65) Prior Publication Data
US 2021/0191465 A1  Jun. 24, 2021

(51) Int. Cl.
*G06F 1/16* (2006.01)
*H01L 51/00* (2006.01)
*H04N 5/64* (2006.01)

(52) U.S. Cl.
CPC .......... *G06F 1/1652* (2013.01); *G06F 1/1641* (2013.01); *G06F 1/1681* (2013.01);
(Continued)

(58) Field of Classification Search
CPC .... G06F 1/1652; G06F 1/1641; G06F 1/1681; H01L 51/0097; H01L 2251/5338; H04N 5/64
See application file for complete search history.

(56) References Cited

U.S. PATENT DOCUMENTS 9,081,540 B1 * 7/2015 Cho ...................... G06F 1/1601
9,274,560 B2    3/2016 Ahn
(Continued)

FOREIGN PATENT DOCUMENTS

CN    101120295    2/2008
CN    103514812    1/2014
(Continued)

OTHER PUBLICATIONS

Clements, "How Fabric PCs Will Work", Retrieved from internet—https://computer.howstuffworks.com/fabric-pc1.htm, 2016, 4 Pages.

*Primary Examiner* — Abhishek M Rathod
(74) *Attorney, Agent, or Firm* — Michael A. Dryja

(57) ABSTRACT

Example implementations relate to a pivoting plate flexible display. For example, an apparatus includes a flexible display device and a support structure adjacent to the flexible display device. The apparatus also includes a pivoting plate device coupled to the support structure, where the pivoting plate device is capable of pivoting about a central connector connected to the support structure to allow the flexible display device to transform from a flat configuration to a curved configuration.

7 Claims, 2 Drawing Sheets

(52) U.S. Cl.
CPC ........... *H01L 51/0097* (2013.01); *H04N 5/64* (2013.01); *H01L 2251/5338* (2013.01)

(56) References Cited

U.S. PATENT DOCUMENTS

| | | | |
|---|---|---|---|
| 9,307,658 | B2 | 4/2016 | Song et al. |
| 2013/0207946 | A1 | 8/2013 | Kim et al. |
| 2015/0029166 | A1* | 1/2015 | Park .................. G09G 3/20 |
| | | | 345/184 |
| 2015/0043136 | A1* | 2/2015 | Kim ............... G02F 1/133305 |
| | | | 361/679.01 |
| 2015/0092361 | A1* | 4/2015 | Cho .................. H01L 51/5237 |
| | | | 361/749 |
| 2015/0296641 | A1 | 10/2015 | Song et al. |
| 2016/0353592 | A1* | 12/2016 | Li ...................... H05K 5/0217 |
| 2017/0188470 | A1* | 6/2017 | Cho ................... G09F 9/301 |
| 2017/0289491 | A1* | 10/2017 | Park .................. G09G 3/3216 |

FOREIGN PATENT DOCUMENTS

| | | |
|---|---|---|
| CN | 103620516 | 3/2014 |
| CN | 203689833 | 7/2014 |
| CN | 104615393 | 5/2015 |
| CN | 104751739 | 7/2015 |
| CN | 105023510 | 11/2015 |
| CN | 105047084 | 11/2015 |
| CN | 105518766 | 4/2016 |
| JP | 2013020043 | 1/2020 |
| KR | 2010-0039040 | 4/2010 |
| KR | 1020110040661 | 4/2011 |
| KR | 2014-0002243 | 1/2014 |
| KR | 20140103801 | 8/2014 |
| KR | 20150018339 | 2/2015 |
| KR | 1020160016334 | 1/2016 |
| KR | 20160019602 | 2/2016 |
| WO | 2015180411 A1 | 12/2015 |

* cited by examiner

PIVOTING PLATE FLEXIBLE DISPLAY

BACKGROUND

Display devices come in any number of designs and sizes, such as display monitors coupled to computing devices, all-in-one computing devices that include the display, tablets, laptop displays, and the like. These devices have traditionally been flat screen devices. However, current technology now allows for display devices that are flexible.

BRIEF DESCRIPTION OF THE DRAWINGS

Some examples of the present application are described with respect to the following figures.

DETAILED DESCRIPTION

As described above, current technology allows for flexible display devices. Flexible display devices may be made of any suitable flexible material capable of displaying content, such as organic light-emitting diode (OLED) flexible display devices. While the shape of these display devices can be changed due to their flexible nature, holding a stable shape for these display devices can be problematic. As such, examples discussed herein include a pivoting plate flexible display device that includes a pivoting plate device to aid in the transformation and stability of a flexible display device from a flat configuration to a curved configuration.

Figure 1:
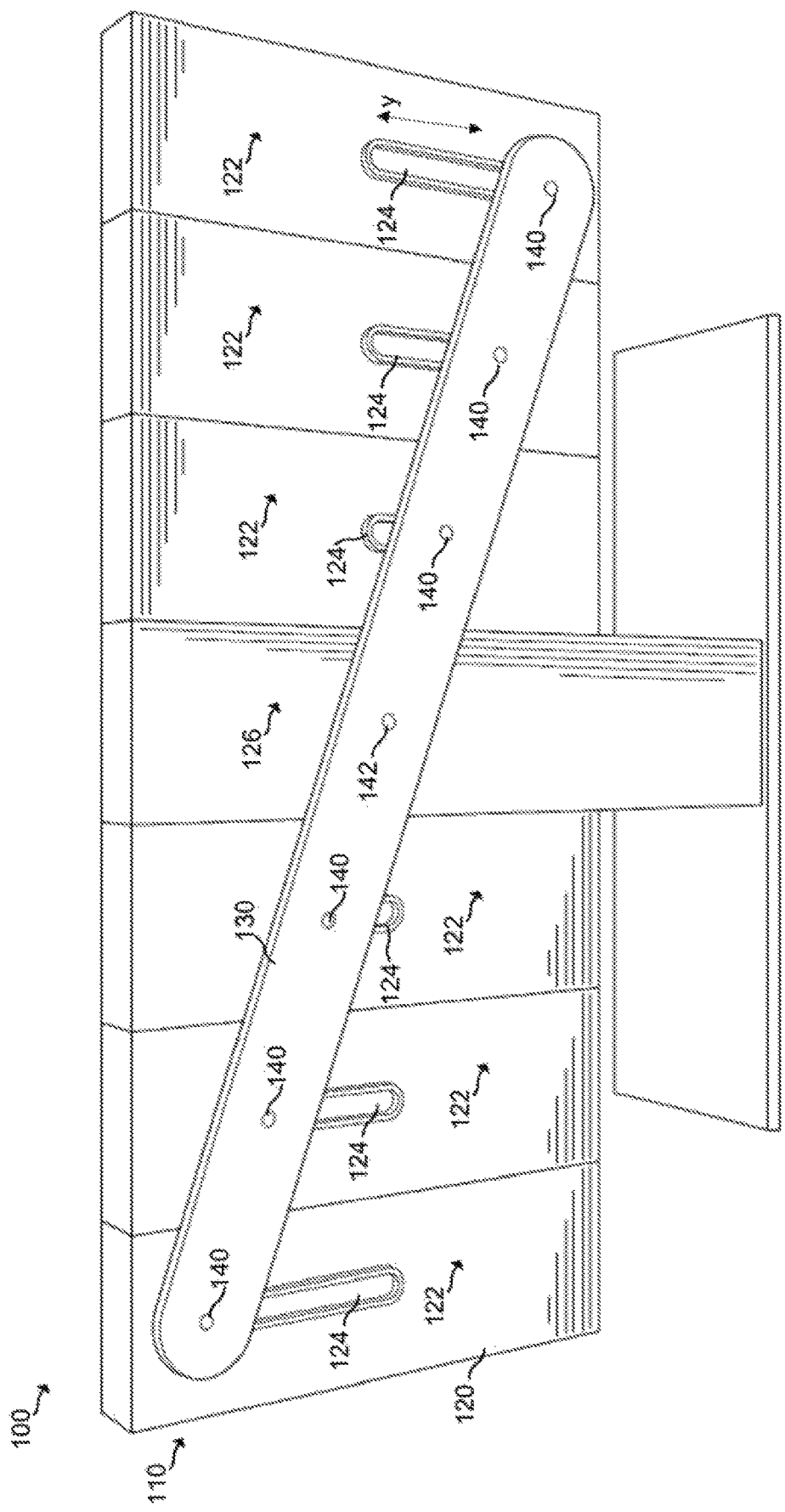
FIG. 1 illustrates a rear view of an example apparatus having a flexible display device that is in a flat configuration.

Referring now to the figures, FIG. 1 illustrates a rear view of an example apparatus 100 having a flexible display device 110 that is in a flat configuration. As used herein, the rearview of the apparatus 100 is the side that is opposite the side on which content is displayed to a user. The apparatus 100 may be any suitable display device, such as a monitor, a tablet, an all-in-one personal computer, and the like. As shown in FIG. 1, the apparatus is in a flat configuration, which may be useful for presenting content to multiple viewers.

The flexible display device 110 is located at the front of the apparatus 100, which is on the side opposite to that shown in FIG. 1 (e.g., on the side that a user would face when viewing content displayed by the apparatus 100) and may be any suitable flexible display device capable of displaying content, such as an OLED flexible display device.

The flexible display device 110 may be adjacent to the support structure 120, which may be any suitable support structure to support the flexible display device 110. The support structure 120 may include a set of surfaces 122 and 126, where each surface 122 and 126 has a guide slot 124 that is an aperture through which a connector 140 connects the pivoting plate device 130 to the support structure 120. The set of surfaces 122 and 126 may be connected to each other using any suitable connectors such that the support structure 120 is capable of maintaining the shape of the flexible display device 110 as it is flexed. For example, the set of surfaces 122 and 126 may be connected to each other using torque hinges. In some examples, the set of surfaces 122 and 126 may be connected to each other with connectors that provide a pivot located at the median line of the support structure 120 such that it is neither compressed nor stretched during the action of flexing or straightening the apparatus 100.

The pivoting plate device 130 may be any suitable flexible surface and may be made of any suitable flexible material, such as a flexible plastic, sheet metal, and the like. As described above, the pivoting plate device 130 may be coupled to the support structure 120 using connectors 140 that run through the pivoting plate device 130 and through the guide slots 124 of the surfaces 122 of the support structure 120. The pivoting plate device 130 may be also be connected to the support structure 120 through a central guide slot of the center surface 126 using a central connector 142, which may be any suitable connector to rotatably fix the pivoting plate device 130 to the support structure 120 such that the central connector 142 acts as pivoting point of the pivoting plate device 130.

Figure 2:
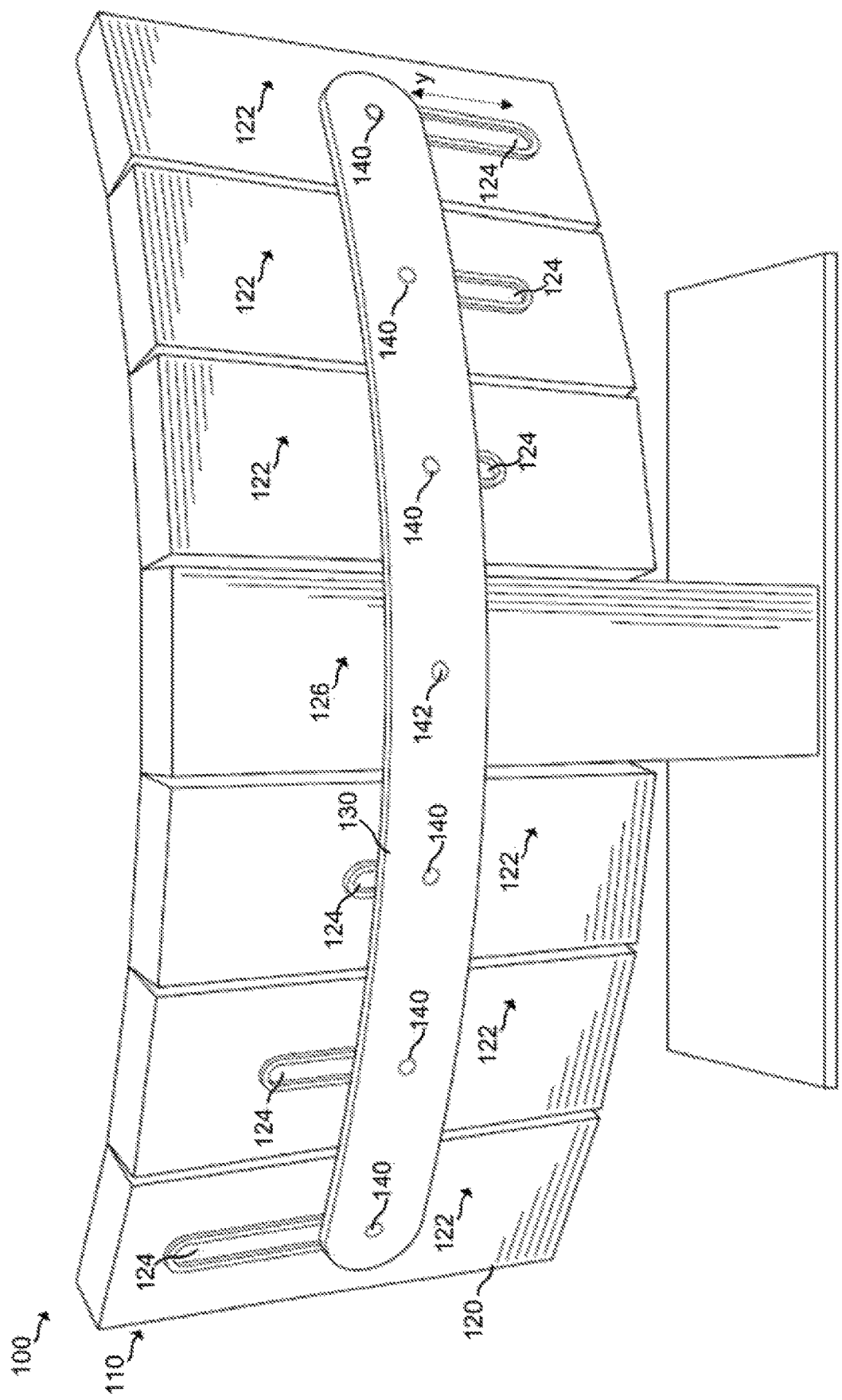
FIG. 2 illustrates a rear view of an example apparatus having a flexible display device that is in a curved configuration.

The pivoting plate device 130 may be capable of pivoting about the central connector 142 to allow the flexible display device 110 to transform from the flat configuration shown in FIG. 1 to the curved configuration shown in FIG. 2, which illustrates the rear view of the example apparatus 100 having the flexible display device 110 that is in a curved configuration. FIG. 2 includes all of the components shown in FIG. 1 but in the curved configuration, which may be useful when a single viewer wishes to view content giving the viewer a more immersive experience. For example, a user facing the front of the apparatus 100 may transform the apparatus 100 from the flat configuration of FIG. 1 to the curved configuration of FIG. 2 by pulling the lateral ends of the support structure 120 toward each other, which may cause the pivoting plate device 130 to pivot counterclockwise about the central connector 142 such that the pivoting plate device 130 moves from the position shown in FIG. 1 to the position shown in FIG. 2. In another example, a user may move the pivoting plate device 130 to a position that would allow the apparatus 100 to be flexed or straightened. As the apparatus 100 is flexed into a curved configuration, the connectors 140 slide vertically within the respective guide slots 124 of the surfaces 122 of the support structure 120 such that the pivoting plate device 130 rotates counterclockwise about the central connector 142 from the position shown in FIG. 1 to the position shown in FIG. 2, which causes the flexible display device 110 as well as the pivoting plate device 130 to become curved. The curved configuration may be held and maintained by the arc bar device 130.

What is claimed is:

1. An apparatus comprising:
    a flexible display device having a horizontal axis and a vertical axis;
    a support structure adjacent to the flexible display device, extending along the vertical axis and along the horizontal axis, and comprising a set of surfaces including a central surface and a plurality of non-central surfaces arranged at either side of the central surface along the horizontal axis, the set of surfaces connected to each other; and
    a pivoting plate device coupled to the support structure, the pivoting plate device is rotatable about a central connector connected to the support structure to allow the flexible display device to transform between a flat configuration and a curved configuration,
    wherein each non-central surface in the set of surfaces includes a guide slot through which a connector connects the pivoting plate device to the support structure, the connector slidable along the vertical direction in the guide slot to transform the flexible display device between the flat configuration and the curved configuration.

2. The apparatus of claim 1, wherein the set of surfaces are connected to each other using torqued hinges.

3. The apparatus of claim 1, wherein the flexible display device is an organic light-emitting diode (OLED) flexible display device.

4. The apparatus of claim 1, wherein the pivoting plate device is flexible.

5. A display comprising:
   an organic light-emitting diode (OLED) flexible display device;
   a support structure adjacent to the OLED flexible display device, extending along a vertical axis and along a horizontal axis, and comprising a set of surfaces including a central surface and a plurality of non-central surfaces arranged at either side of the central surface along the horizontal axis, the set of surfaces connected to each other; and
   a pivoting plate device coupled to the support structure, the pivoting plate device rotatable about a central connector connected to the support structure to allow the OLED flexible display device to transform between a flat configuration and a curved configuration,
   wherein each non-central surface in the set of surfaces includes a guide slot through which a connector connects the pivoting plate device to the support structure, the connector slidable along the vertical direction in the guide slot to transform the OLED flexible display device between the flat configuration and the curved configuration.

6. The display of claim 5, wherein the set of surfaces are connected to each other using torqued hinges.

7. The display of claim 5, wherein the pivoting plate device is flexible.

* * * * *